Feb. 2, 1965 M. E. CLYNES 3,168,703
SWITCHING TYPE AMPLIFIER FOR BATH A.C. AND D.C. SIGNALS
Filed Feb. 8, 1961
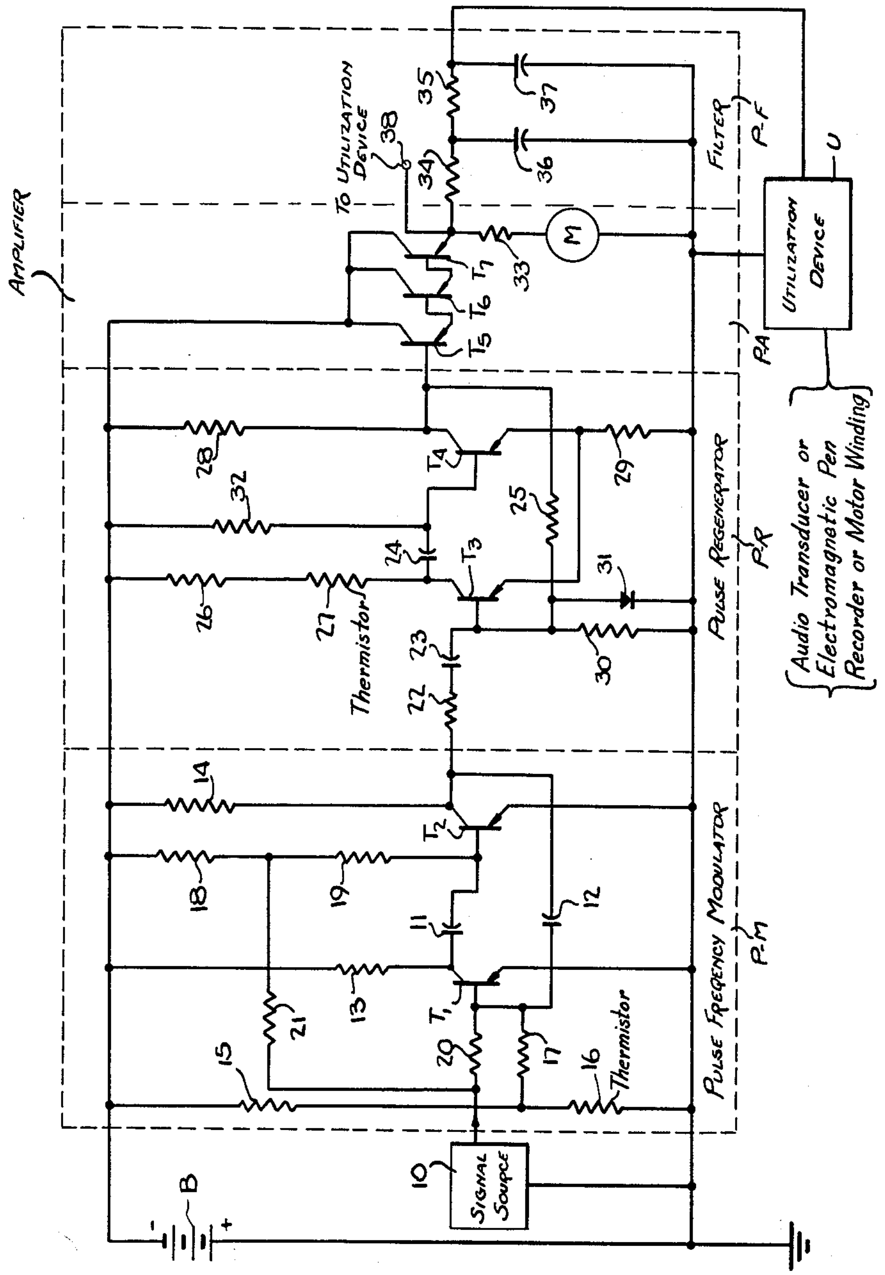
INVENTOR.
MANFRED E. CLYNES
BY
ATTORNEYS United States Patent Office 3,168,703
Patented Feb. 2, 1965

3,168,703

SWITCHING TYPE AMPLIFIERS FOR BOTH A.C. AND D.C. SIGNALS

Manfred E. Clynes, Orangeburg, N.Y., assignor, by mesne assignments, to Technical Measurement Corporation, North Haven, Conn., a corporation of Delaware Filed Feb. 8, 1961, Ser. No. 87,901
9 Claims. (Cl. 330—10)

The present invention relates generally to electronic amplifiers and more particularly to broad-band amplifiers adapted to amplify direct-current as well as relatively high-frequency signals, such amplifiers being useful not only in audio applications but also in conjunction with servo control devices and for all types of automatic control systems as well as in the instrumentation field.

There is a growing need for electronic amplifiers adapted to function in the audio range and above, and which are also capable of operating effectively in the D.C. range where slow variations in D.C. level are encountered. For example, in process control systems, small changes in flow and other conditions are often sensed by detectors, such as strain gauges, whose output is in direct-current terms. It is essential that amplifiers coupled to such detectors not only be sensitive to slight variations in D.C. level but that the amplified signal be free of noise and distortion, otherwise spurious readings will be obtained.

It is known that transistors may be directly coupled to provide signal gain down to direct-current or to minimize the number of components as compared to A.C. amplifiers. The principal disadvantage of direct coupled circuits is the drift in operating point arising with changes in temperature or in transistor parameters. This is particularly the case in the first stages of a multi-stage circuit since bias changes occurring in these stages emerge in amplified form in succeeding ones. While it is possible to compensate direct-coupled transistor amplifiers for drift, such compensation entails elaborate and expensive circuits. The drawbacks incident to such transistor amplifiers are also found in D.C. vacuum tube amplifiers.

Other approaches toward D.C. amplification have been attempted wherein the D.C. signal is converted into a frequency modulated signal or is chopped periodically to provide amplitude-modulated pulses which may be amplified by conventional circuits. However, these techniques require discriminators, amplitude detectors and other complex means to recover the D.C. signal and the resultant system is costly.

In view of the foregoing, it is the main object of this invention to provide a novel amplifier system which obviates the above difficulties and which is capable of amplifying direct-current as well as high-frequency signals.

It is also an object of the invention to provide an improved broad-band signal amplifier capable of linear amplification and which is free of drift caused by temperature, variations in transistor parameters as a result of aging or other effects.

Yet another object of the invention is to provide a signal amplifier of the above-described type which is of simple design, which is reliable in operation and which may be manufactured at low cost.

More specifically it is an object of the invention to provide an amplifier wherein the input signal is converted into a train of pulses whose amplitude and duration are independent of the signal but whose repetition rate is a function of the signal amplitude, the pulses so produced being conveyed to a utilization device responsive only to the D.C. component.

A significant advantage of the invention resides in the fact that the signal of varying amplitude representing the input information is translated into low level pulses of varying frequency, which low level pulses may be regenerated as standardized pulses and fed without distortion through switching or class D amplifiers until a desired power level is attained, at which point the amplified D.C. component may be extracted from the pulses.

In using switching amplifiers, the amplifying components operate as switches only and this makes possible a far greater power gain per stage than was previously possible. The switching components are driven from a completely "on" to a completely "off" position, as distinguished from conventional class A, B and C amplifiers which make use of the amplifier characteristics. For purposes of classification, the switching amplifier disclosed herein will be called class D. Since the invention utilizes the amplifying components only in their completely on-off condition, the amplifier design is rendered insensitive to variations in the characteristics of these components.

For a better understanding of the invention, as well as other objects thereof, reference is made to the following detailed description to be read in conjunction with the accompanying drawing schematically showing a preferred embodiment of an amplifier circuit in accordance with the invention.

*General description*

Referring now to the drawing, the main components of an amplifier in accordance with the invention are a pulse frequency modulator, generally designated by reference character P–M, a pulse regenerator P–R, a class D or switching amplifier P–A, and a passive filter network P–F to recover the amplified modulation component from the amplified pulses. The amplified signal is fed to a utilization device U.

In operation, input signals to be amplified are applied from a signal source 10 to the pulse frequency modulator P–M in the form of an astable multivibrator to produce pulses having a repetition rate which is linearly proportional to the amplitude of the signal throughout a wide range. Signals from source 10 may extend from slowly varying D.C. analog voltages to oscillations in the megacycle range.

The pulse train from pulse modulator P–M is applied to pulse regenerator P–R preferably in the form of a monostable multivibrator which generate pulses of the same repetition rate but having a constant amplitude and duration independent of the pulses from the modulator. The regenerated pulses are amplified without distortion in switching amplifier P–A and are then fed through the low pass filter P–F which extracts the direct-current modulation component from the pulses, thereby faithfully recreating the original signal in highly amplified form.

*Pulse-frequency modulator*

The linear pulse frequency modulator P–M is constituted by a pair of transistors $T_1$ and $T_2$ which are cross-coupled to form an astable asymmetrical multivibrator generating carrier pulses which, in practice, may be in the megacycle range. The application of a modulation voltage to the multivibrator causes the frequency or repetition of the pulses generated thereby to vary about the carrier frequency in accordance with the amplitude of the signal.

In the multivibrator circuit, the collector of transistor $T_1$ is coupled through condenser 11 to the base of transistor $T_2$ and the collector of transistor $T_2$ is connected through condenser 12 to the base of transistor $T_1$, the emitters of both transistors being grounded. The operating frequency of the multivibrator is determined primarily by these capacitors.

A voltage source in the form of battery B is provided, the positive terminal thereof being grounded, the negative terminal being connected through resistors 13 and 14 to the collectors of transistors $T_1$ and $T_2$, respectively. Thus the emitter of each transistor is positively biased relative to the collector thereof.

Shunted across battery B is a voltage divider formed by resistor 15 in series with a thermistor 16, the junction thereof being connected through resistor 17 to the base of transistor $T_1$. The base of transistor $T_2$ is connected through serially-connected resistors 18 and 19 to the negative terminal of battery B. The signal source 10 is connected, with respect to ground, through resistor 20 to the base of transistor $T_1$ and also to the junction of resistors 18 and 19 through resistor 21.

To ensure an initial degree of linearity wherein deviation from linearity is limited to 2 to 3% between the amplitude of the modulating signal and the repetition rate of the generated pulses for frequency changes of two octaves, there must be a proper degree and kind of asymmetry in the action of the multivibrator.

The speed of recovery depends inversely upon the size of the condenser to be charged and directly upon the amount of current which is made to flow through it. In the case of a bistable circuit, condensers will ordinarily not exceed 500 mmf. in value, with a corresponding small recovery time.

It has been found that to achieve the proper asymmetry characteristics, the value of the feedback capacitor 12 between the collector of transistor $T_2$ and the base of transistor $T_1$ should be at least five times greater than the coupling capacitor 11 between the collector of transistor $T_1$ and the base transistor $T_2$. In addition to the unequal capacitors, unequal bias and load resistors effect the desired asymmetry. The resultant asymmetry in the multivibrator action brings about an initial degree of modulation linearity in which the deviation therefrom is in the order of 2 to 3%.

A further improvement in the linearity is obtained by feeding the modulation signal not only to the base of transistor $T_1$ but also the biasing circuit in the base of transistor $T_2$. This simultaneous application of the modulation signal to the base circuits of both transistors is effected through resistor 20 for transistor $T_1$ and resistor 21 for transistor $T_2$. Linearity is further improved if the series-connected resistors 18 and 19 are substantially equal in value, the modulating signal from resistor 21 being applied to the junction thereof.

It has been found that with an asymmetrical multivibrator, as above described, wherein the modulation signal is concurrently fed to the base circuits of both transistors, the linearity is optimized to within 0.1%. Pulse frequency modulator P–M acts to generate a train of pulses having about a 15% duty cycle, the repetition rate varying linearly about a center or carrier value in accordance with amplitude variations in the modulating signal.

Transistors are solid state devices and are characteristically temperature-sensitive. This factor, unless corrected, gives rise to fluctuations in the operating frequency of the free-running multivibrator. Thus accompanying an elevation in the ambient temperature to which transistor $T_1$ is subjected, is an increase in the sensitivity of the transistor, and conduction will occur for a small input signal at the base thereof. This effect is corrected by thermistor 16 which is temperature-sensitive and which decreases in resistance in response to a rise in ambient temperature. The decrease in resistance of the thermistor in the voltage divider which includes resistor 15 serves to decrease the bias on the base of $T_1$ and a greater signal amplitude is required to cause conduction of transistor $T_1$, thereby compensating for the change in sensitivity.

*Pulse-regenerator*

Output pulses from the pulse-frequency modulator P–M are taken from the collector of transistor $T_2$ and are fed through serially-connected resistor 22 and capacitor 23 to the base of a transistor $T_3$ of the pulse regenerator P–R which also includes a transistor $T_4$. Transistors $T_3$ and $T_4$ are intercoupled to form a monostable multivibrator.

The monostable multivibrator circuit comprises a capacitor 24 connected between collector of transistor $T_3$ and base of transistor $T_4$, and a resistor 25 connected between collector of transistor $T_4$ and base of transistor $T_3$. The negative terminal of battery B is connected through series-connected resistor 26 and thermistor 27 to collector $T_3$, and through resistor 28 to collector $T_4$. The emitters of transistors $T_3$ and $T_4$ are connected through resistor 29 to ground. The base of transistor $T_3$ is connected to ground through resistor 30 shunted by diode 31, and the base of transistor $T_4$ is connected through resistor 32 to the negative end of battery B.

The capacitor 23 in conjunction with resistor 30 acts as a differentiating network with respect to the rectangular pulses from the pulse frequency modulator P–M to provide triggering pulses for the pulse-regenerator P–R, the differentiated pulses being clipped by the bias clamping diode 31. For each trigger pulse applied to the monostable multivibrator, a single regenerated pulse is produced of constant amplitude and duration, the shape of the regenerated pulse being independent of the shape of the input triggering pulse.

To ensure a constant pulse duration with possible variations in temperature, the thermistor 27 in the collector circuit of transistor $T_3$ decreases in resistance with a rise in temperature to change the collector bias. Thus the increased sensitivity of transistor $T_3$ with an increase in temperature is compensated for by the change in the bias on the collector of transistor $T_3$.

*Amplification and demodulation*

Pulse regenerator P–R transmits to amplifier P–A a train of standardized pulses of constant amplitude and duration, the pulses having a repetition rate which varies linearly with the amplitude of the original signal from source 10. The direct-current component of the train of pulses is a replica of the signal from signal source 10.

The train of standardized pulses emerging from the collector of transistor $T_4$ in the monostable multivibrator is fed to a class D or switching amplifier P–A which for purposes of illustration is shown as including transistors $T_5$, $T_6$ and $T_7$ in cascade relation, the switching transistors being arranged in response to the applied pulses to go from a completely "off" to a completely "on" condition.

As pointed out previously, the switching amplifier provides an exceptionally high power gain per stage, and since the amplifier acts as a switch its equivalent circuit in the case of transistors looks alternately like an open and short circuit, essentially zero and infinite impedance. It is also possible to obtain similar switching actions with electron power tubes, but the internal impedance, when the tube is turned on, is not fully equivalent to a short circuit. However, an extremely low impedance switching action may be obtained with gaseous discharge tubes, such as thyratrons, but in this case a differentiating circuit will have to be provided to extinguish the thyratron at the trailing edge of the pulse. Of course the pulse can be made either positive or negative, depending on the particular need.

Thus, in lieu of transistors as switching elements, the output of transistor $T_4$ may be fed to an electron power tube whose output may be applied to an inductive utilization device, such as a mechanical electromagnetic relay in say a hydraulic fluid system in which the flow of fluid is relay controlled. The power switching tubes may be connected in cascade with a power pentode in the output stage. It will be obvious that many switching transistor or tube arrangements are possible to effect class D operation.

The emitter of transistor $T_7$ is connected through output resistor 33 in series with output meter M to ground.

Meter M may be of the electromechanical type having sufficient inertia to render it insensitive to the relatively high frequencies of the incoming pulses whereby the meter responds only to the D.C. modulation component to provide an output reading.

At the same time, the train of standardized pulses is fed through low-pass filter P-F which is constituted by an iterative resistance-capacitance network. The network consists of series-connected resistors 34 and 35 and capacitors 36, 37 connected between the respective ends of said resistors and ground. The low-pass filter rejects the relatively high repetition frequency of the pulses and passes the D.C. modulation component to utilization device U, which in the case of a process control arrangement may be a servo control system.

The D.C. amplifying system disclosed herein may be used in conjunction with servo control systems where it would replace magnetic or vacuum tube amplifiers feeding into the field or armature of the servo motors. As is known, magnetic amplifiers suffer from a serious limitation in that the speed of response is limited to the carrier frequency usually employed, which is either 60 or 400 cycles. The present system would be smaller, cheaper and much faster in its response. Other uses for the D.C. amplifying system in accordance with the invention are in the field of instrumentation, as for driving recording pen motors, the motor acting to average the pulses applied thereto. The amplifying system is also useful for all types of automatic control devices.

In the field of audio amplification, the present system has many advantages over existing amplifiers, but these advantages involve different considerations from those which come into play in the instrumentation field. Thus in the audio field no amplification in the D.C. region is necessary for it is sufficient for an audio amplifier response to go down to a frequency of one cycle per second. As far as the human ear is concerned, audio signals of 30 cycles and below are almost inaudible. There is therefore no advantage gained in going lower than one cycle. Problems of drift, temperature stability and of change in characteristics are relatively unimportant in this context, and even power gain per stage is not particularly important although well worth having.

The superior results obtained by the invention in the field of audio amplification are based on the following factors. In combination with tape recorders it is possible to use a carrier frequency just barely above the audible range, say in the range of 25 to 30 kilocycles. This ultrasonic carrier may be recorded on a good quality audio tape recorder. The fact that the frequency response of the recorder is not flat in the range of frequencies involved is of no concern, for the reproduced pulse trains are used as triggered only. The frequency range used for example in the modulated carrier might be from 15 to 30 kc. or from 20 to 35 kc.

Heretofore it was not feasible to use frequency-modulated audio systems in conjunction with tape recorders. Although instrumentation type of FM tape recorders are available to record frequencies from 0 to 10,000 cycles, they can do this only with tape speeds of 16 inches per second. In practice, the present invention will work at 7½ inches per second and it requires a carrier frequency of only twice the range of the audio frequencies involved.

The reason for this also lies in the nature of the demodulation employed. By feeding the regenerated pulses directly to an audio speaker, such as a dynamic unit, several advantages are realized. The speaker responds only to the modulation component and not to the carrier frequency which is above the audible range and the loss involved in most demodulators is avoided. By using pulses whose effective D.C. equivalent changes, a speaker will respond to such a train of pulses as if they were the equivalent D.C.

This is not so with sinusoidal carriers whose equivalent D.C. is always zero. This of course also eliminates an output transformer and the distortion incident thereto, to say nothing of cost and weight. The method according to the invention of pulse frequency modulating on magnetic tape further insures that no harmonic distortion, no amplitude distortion and no background noise exists. Thus all of the advantages of FM become now available on magnetic tape recording.

Representative values for the pulse frequency modulator and pulse regenerator are as follows:

| | | |
|---|---|---|
| Resistors: | | |
| **14** | ohms | 10,000 |
| **17** | do | 100,000 |
| **15** | do | 56,000 |
| **13** | do | 2,200 |
| **18** | do | 27,000 |
| **19** | do | 27,000 |
| **21** | do | 270,000 |
| **20** | do | 100,000 |
| **22** | do | 100,000 |
| **29** | do | 47,000 |
| **30** | do | 56,000 |
| **26** | do | 6,800 |
| **28** | do | 2,200 |
| **32** | do | 62,000 |
| **25** | do | 100,000 |
| Capacitors: | | |
| **11** | mmf | 500 |
| **12** | mmf | 22,000 |
| **23** | mmfd | 220 |
| **24** | mmfd | 2,000 |
| Transistors $T_1$ and $T_2$ | | CK 722 |
| Transistors $T_3$ and $T_4$ | | 2N269 |
| Thermistor **27** | | GE D 052 |
| Diode **31** | | Hughes 1 N96 |

The switching amplifier PA follows as a slave, the pulse train introduced to it by the pulse shaper or regenerator PR, the power stage being turned on and off with a variable duty cycle. The duty cycle is precisely proportional to the input signal to the amplifier.

From the power amplifier stage the power pulse train may be fed directly to a utilization device at terminal 38, the device acting as a filter to the pulse train and responding only to its average value, i.e., its duty cycle. Thus by varying the relative on-off time of the power output stage $T_5$, $T_6$, $T_7$, the power to the utilization device is regulated by the input to the amplifier.

The pulse frequency is ordinarily relatively high compared to the response time of the utilization device. For example, when the invention is used as a servo amplifier, the utilization device is the field or armature of a motor. In this case, a pulse frequency of 10,000 c.p.s. which may be modulated say from 5,000 to 15,000 c.p.s. is entirely suitable for such an operation.

Since with no input, a carrier frequency exists there will be a power output for zero signal input, this being analogous to the output of a magnetic amplifier. For some applications this is advantageous, in others it can be balanced in a push-pull manner. The frequency responses attainable with the D.C. amplifier system is from zero to as high as 1 megacycle. It is limited by the frequency response of the class D output stage, and as pointed out previously, no output transformer is necessary since power transistors can be used which feed directly into a low impedance load.

Input power required for the D.C. amplifying system is D.C. power at a voltage equal to or greater than the maximum output voltage required. No A.C. power of any kind is required as for magnetic amplification. This means operations possible where A.C. *is not available.* D.C. power obtained from a rectified A.C. power source need be regulated no better than the output amplitude stability required. Practically no power is required which is not fed into the utilization device, thus creating higher efficiency.

Power amplification per power stage is readily 1,000,-

000. Thus an input of 50 microwatts can be used to control 50 watts for a single power stage amplification. Any number of switching devices may be cascaded together thus producing a power gain per stage far exceeding that of conventional amplifiers even when operated as class C amplifiers.

The fact that the power transistor is used only entirely on or entirely off means that practically no power dissipation takes place within the transistor since in the entirely off condition no current flows and in the entirely on condition the voltage drop across the transistor is minimal so that the power is all used by the utilization device. This means that the heating of power transistor is much less than that of a similarly used conventional power stage where the point of operation is such that a considerable fraction of the power is dissipated in the semi-conductor material of the transistor. This makes it possible to carry much heavier loads than in conventional output stages for the same power transistor. Unlike conventional amplifiers, linearity is inherent and negative feedback expedients to maintain linearity are unnecessary in the switching amplifier.

In the system disclosed above, pulses are generated whose repetition rate varies as a function of the amplitude of the input signal. It is to be understood however that comparable amplification results may be obtained by modulating the width or duration of pulses having a constant repetition rate. This may be done by introducing the incoming signal to the bases of the pulse regenerator PR instead of to the bases of the pulse frequency modulator.

While there has been shown what are considered to be preferred embodiments of the invention, it will be manifest that many changes and modifications may be made therein without departing from the essential spirit of the invention. It is intended, therefore, in the annexed claims to cover all such changes and modifications as fall within the true scope of the invention.

What is claimed is:

1. A broad-band amplifying system for a signal of varying amplitude and providing signal gain down to direct-current comprising means responsive to amplitude variations in the incoming signal to generate primary pulses having a repetition rate which varies as a function of the amplitude of said signal, means responsive to said primary pulses to produce standardized pulses with the identical repetition rate but with a constant pulse amplitude and duration, switching amplifier means to amplify said standardized pulses, and means responsive solely to the direct-current component in said standardized pulses to recreate said signal in amplified form.

2. A system, as set forth in claim 1, wherein said means is constituted by an audio transducer directly responsive to said standardized pulses.

3. A system, as set forth in claim 1, wherein said means is constituted by a motor winding.

4. A system as set forth in claim 1, wherein said means is an electromagnetic pen recorder.

5. A broad-band amplifying system for a signal of varying amplitude and providing signal gain down to direct-current comprising a pulse frequency modulator responsive to amplitude variations in the incoming signal to generate primary pulses having a repetition rate which varies as a function of the amplitude of said signal, a pulse regenerator coupled to said modulator and responsive to said primary pulses to produce standardized pulses with the same repetition rate but with a constant pulse amplitude and duration, switching amplifier means to amplify said standardized pulses, and means responsive solely to the direct-current component in said standardized pulses to recreate said signal in amplified form.

6. A broad-band amplifying system for a signal of varying amplitude and providing signal gain down to direct-current comprising a pulse frequency modulator responsive to amplitude variations in the incoming signal to generate primary pulses having a repetiton rate which varies as a function of the amplitude of said signal, a pulse regenerator coupled to said modulator and responsive to said primary pulses to produce standardized pulses with the same repetition rate but with a constant pulse amplitude and duration, a binary pulse switching amplifier coupled to said regenerator to amplify said standardized pulses, and a lowpass filter coupled to said amplifier to derive from the amplitude pulses the direct-current component therein thereby to recreate said signal in amplified form.

7. A broad-band amplifying system for a signal of varying amplitude and providing signal gain down to direct-current comprising a pulse-frequency modulator responsive to said input signal to produce pulses having a repetition rate which varies linearly about a carrier value as a function of the amplitude of said signal, a trigger responsive pulse-regenerator producing standardized pulses of constant amplitude and duration, means to differentiate the pulses from said modulator to produce triggering pulses, said triggering pulses being applied to said regenerator to provide for each input triggering pulse a single standardized pulse, a switching pulse-amplifier coupled to said regenerator to provide amplified standardized pulses, and a low-pass filter coupled to the output of said amplifier to derive the direct-current component from said amplified standardized pulses thereby to recreate said signal in amplified form.

8. A broad-band amplifying system for a signal of varying amplitude and providing signal gain down to direct-current comprising a pulse-frequency modulator responsive to said input signal to produce pulses having a repetition rate which varies about a carrier value as a function of the amplitude of said signal, said modulator being constituted by an astable multivibrator formed by a pair of cross-coupled transistors, a trigger responsive pulse-regenerator constituted by a monostable multivibrator producing standardized pulses of constant amplitude and duration, means to differentiate the pulses from said modulator to produce triggering pulses, said triggering pulses being applied to said regenerator to provide for each input triggering pulse a single standardized pulse, a switching pulse-amplifier coupled to said regenerator to provide amplified standardized pulses, and a low-pass filter coupled to the output of said amplifier to derive the direct-current component from said amplified standardized pulses thereby to recreate said signal in amplified form.

9. A system, as set forth in claim 8, wherein said amplifying means is constituted by multiple transistor stages in cascade relation arranged to be rendered simultaneously conductive in response to said standardized pulses, said stages being initially non-conductive to produce an on-off switching action.

References Cited in the file of this patent

UNITED STATES PATENTS

| | | |
|---|---|---|
| 2,456,089 | Shenk et al. | Dec. 14, 1948 |
| 2,551,771 | Spielman | May 8, 1951 |
| 2,574,690 | Clark | Nov. 13, 1951 |
| 2,673,331 | Liguori | Mar. 23, 1954 |
| 2,688,664 | Stites et al. | Sept. 7, 1954 |
| 2,864,905 | Grantges et al. | Dec. 16, 1958 |
| 2,974,288 | Norgaard | Mar. 7, 1961 |
| 2,990,516 | Johannessen | June 27, 1961 |
| 2,991,415 | Pierson | July 4, 1961 |
| 3,021,437 | Fleisher | Feb. 13, 1962 |